US012366553B2

(12) United States Patent
Gu

(10) Patent No.: US 12,366,553 B2
(45) Date of Patent: Jul. 22, 2025

(54) INTEGRATED ROPE DEFECT SENSING SYSTEM

(71) Applicant: Columbus McKinnon Corporation, Getzville, NY (US)

(72) Inventor: Yunji Gu, Charlotte, NC (US)

(73) Assignee: Columbus McKinnon Corporation, Getzville, NY (US)

( * ) Notice: Subject to any disclaimer, the term of this patent is extended or adjusted under 35 U.S.C. 154(b) by 104 days.

(21) Appl. No.: 18/131,515

(22) Filed: Apr. 6, 2023

(65) Prior Publication Data

US 2024/0337623 A1 Oct. 10, 2024

(51) Int. Cl.
*G01N 27/82* (2006.01)
*B66D 3/26* (2006.01)
*G01R 33/07* (2006.01)

(52) U.S. Cl.
CPC ............... *G01N 27/82* (2013.01); *B66D 3/26* (2013.01); *G01R 33/07* (2013.01)

(58) Field of Classification Search
CPC . G01N 27/82; B66D 3/26; B66D 1/54; G01R 33/07
See application file for complete search history.

(56) References Cited

U.S. PATENT DOCUMENTS

| 7,004,373 B1* | 2/2006 | Miller | H01L 24/85 228/103 |
| 7,770,744 B2* | 8/2010 | Scharf | B66D 5/16 188/65.1 |
| 8,164,329 B2 | 4/2012 | Yoshioka et al. | |
| 10,962,606 B2 | 3/2021 | Yoo et al. | |
| 2004/0143364 A1* | 7/2004 | Colgate | B66C 13/063 700/213 |

(Continued)

FOREIGN PATENT DOCUMENTS

| EP | 2151411 B1 | 10/2011 |
| JP | 4179149 B2 | 11/2008 |
| KR | 101799378 B1 | 12/2017 |

OTHER PUBLICATIONS

Xu et al., "Inspection method of cable-stayed bridge using magnetic flux leakage detection: principle, sensor design, and signal processing", Journal of Mechanical Science and Technology 26 (3) (2012) 661-669.

(Continued)

*Primary Examiner* — Dominic E Hawkins
(74) *Attorney, Agent, or Firm* — PHILLIPS LYTLE LLP

(57) ABSTRACT

A hoisting rope sensor assembly for use with a rope hoist. A rope guide is configured to mount around a rotating drum having a spiral rope groove defined therein. The spiral rope groove on the rotating drum is configured to receive the hoisting rope as it winds and unwinds from the rotating drum. The rope guide is configured to move laterally relative to the rotating drum to keep the hoisting rope in the spiral rope groove when winding the hoisting rope onto the rope groove or unwinding it from the rope groove. An idler sheave has a groove defined therein for guiding the hoisting rope. A magnetic flux leakage sensor surrounds the hoisting rope. The magnetic flux leakage sensor is disposed between the idler sheave and the rope guide. The magnetic flux leakage sensor and idler sheave move with the rope guide relative to the rotating drum.

20 Claims, 5 Drawing Sheets

(56) References Cited

U.S. PATENT DOCUMENTS

2011/0024378 A1* 2/2011 Pleuss .................... B66C 13/18
                                                        212/270
2017/0038338 A1* 2/2017 Kondoh ................ G01N 27/82
2019/0079053 A1* 3/2019 Hirota .................... G01N 27/87
2022/0120711 A1* 4/2022 Wickert ................. E01D 19/16

OTHER PUBLICATIONS

Hongyao et al. "A sensor model for defect detection in mine hoisting wire ropes based on magnetic focusing", Insight vol. 59, No. 3, Mar. 2017 143-148.
A Sensor Model for Defect Detection in Mine Hoisting Wire Ropes Based on Magnetic Focusing, Mar. 12, 2017, Wang Hongyao, Tian Jie, and Meng Guoying.
Inspection Method of Cable-Stayed Bridge Using Magnetic Flux Leakage Detection: Principle, Sensor Design, and Signal Processing, Dec. 1, 2011, Fengyu Xu, Xingsong Wang, Hongtaowu.
European Patent Office, European Search Report dated Sep. 16, 2024.

* cited by examiner

INTEGRATED ROPE DEFECT SENSING SYSTEM

TECHNICAL FIELD

The present invention relates generally to the field of material handling equipment such as hoists and cranes, and more particularly to a wire diagnosis apparatus mounted on a wire rope hoist.

BACKGROUND ART

U.S. Pat. No. 10,962,606 discloses a magnetic field sensor part that measures a leakage magnetic flux generated by a pair of magnets to diagnose the condition of the wire rope and send the information to a user's computer in real time. The sensor is mounted on the bottom block at the inlet or outlet where the wire rope comes in and out of the bottom block.

BRIEF SUMMARY OF THE INVENTION

With parenthetical reference to the corresponding parts, portions or surfaces of the disclosed embodiment, merely for the purposes of illustration and not by way of limitation, the present invention provides a hoisting rope sensor assembly (8). The assembly includes a hoisting rope (25). A rope guide (10) is configured to mount around a rotating drum (17) having a spiral rope groove defined therein. The spiral rope groove on the rotating drum (17) is configured to receive the hoisting rope (25) as it winds and unwinds from the rotating drum (17). The rope guide (10) is configured to move laterally relative to the rotating drum (17) to keep the hoisting rope (25) in the spiral rope groove when winding the hoisting rope (25) onto the rope groove or unwinding it from the rope groove.

An idler sheave (34) has a groove defined therein for guiding the hoisting rope (25).

A magnetic flux leakage sensor (37) surrounds the hoisting rope (25). The magnetic flux leakage sensor (37) is disposed between the idler sheave (34) and the rope guide (10). The magnetic flux leakage sensor (37) and idler sheave (34) move with the rope guide (10) relative to the rotating drum (17).

In another aspect, the idler sheave (34) is mounted to a support frame member (28).

In another aspect, the rope guide (10) is mounted to the support frame member (28).

In a further aspect, the hoisting rope (28) is magnetized by at least two permanent magnets in a sensing head.

In yet a further aspect, a radial magnetic flux leakage corresponding to a rope defect is detected by Hall effect sensors as the hoisting rope (25) passes through the sensing head.

In another aspect, a straight rope section (40) is formed between the idler sheave (34) and the rope guide (10) and the straight rope section (40) is formed independent of the position of a bottom block (43).

In yet another aspect, the idler sheave (34) is arranged to guide the hoisting rope (25) with a small deflection angle to reduce the hoisting rope (25) reaction on the sheave (34) when the bottom block (43) moves to its upper and lower limit positions.

In a further aspect, the hoisting rope (25) is a wire rope.

In a further aspect, the rope guide (10) surrounds the rotating drum (17).

In another embodiment of the invention, the invention may further comprise a wire rope hoist system (100) for raising and lowering a load. The wire rope hoist system (100) comprises a rotating drum (17) having a spiral rope groove defined therein.

A shaft is operatively associated with the rotating drum (17).

A motor (18) is configured to engage with and rotate the shaft.

A hoisting rope (25) is affixed to the drum (17) and is configured to wind onto and unwind from the spiral rope groove.

A rope guide (10) is configured to mount around the rotating drum (17). The rope guide (10) is configured to move laterally relative to the rotating drum (17) to keep the hoisting rope (25) in the spiral rope groove when winding the hoisting rope (25) into the rope groove or unwinding it from the rope groove.

An idler sheave (34) has a groove defined therein for guiding the hoisting rope (25).

A magnetic flux leakage sensor (37) surrounds the hoisting rope (25). The magnetic flux leakage sensor (37) is disposed between the idler sheave (34) and the rope guide (10).

The magnetic flux leakage sensor (37) and idler sheave (34) move with the rope guide (10) relative to the rotating drum (17).

A bottom block (43) has a hook (50) extending therefrom. The bottom block (43) has one or more sheaves (34) with grooves configured to receive the hoisting rope (25) for raising and lowering the load.

In another aspect, the idler sheave (34) is mounted to a support frame member (28).

In another aspect, the rope guide (25) is mounted to the support frame member (28).

In a further aspect, the hoisting rope (25) is magnetized by at least two permanent magnets in a sensing head.

In yet another aspect, a radial magnetic flux leakage corresponding to a rope defect is detected by Hall effect sensors as the hoisting rope (25) passes through the sensing head.

Another aspect of the invention is a straight rope section formed between the idler sheave (34) and the rope guide (10). The straight rope section is formed independent of the position of the bottom block (43).

In another aspect, the idler sheave (34) is arranged to guide the hoisting rope (25) with a small deflection angle to reduce the hoisting rope (25) reaction on the sheave (34) when the bottom block (43) moves to its upper and lower limit positions.

In yet another aspect the hoisting rope (25) is a wire rope.

In a further aspect the rope guide (10) surrounds the rotating drum (17).

In another aspect the rope hoist system (100) is a monorail wire rope hoist.

In yet another aspect the rope hoist system (100) is a top running wire rope hoist.

DESCRIPTION OF THE PREFERRED EMBODIMENTS

Figure 1:
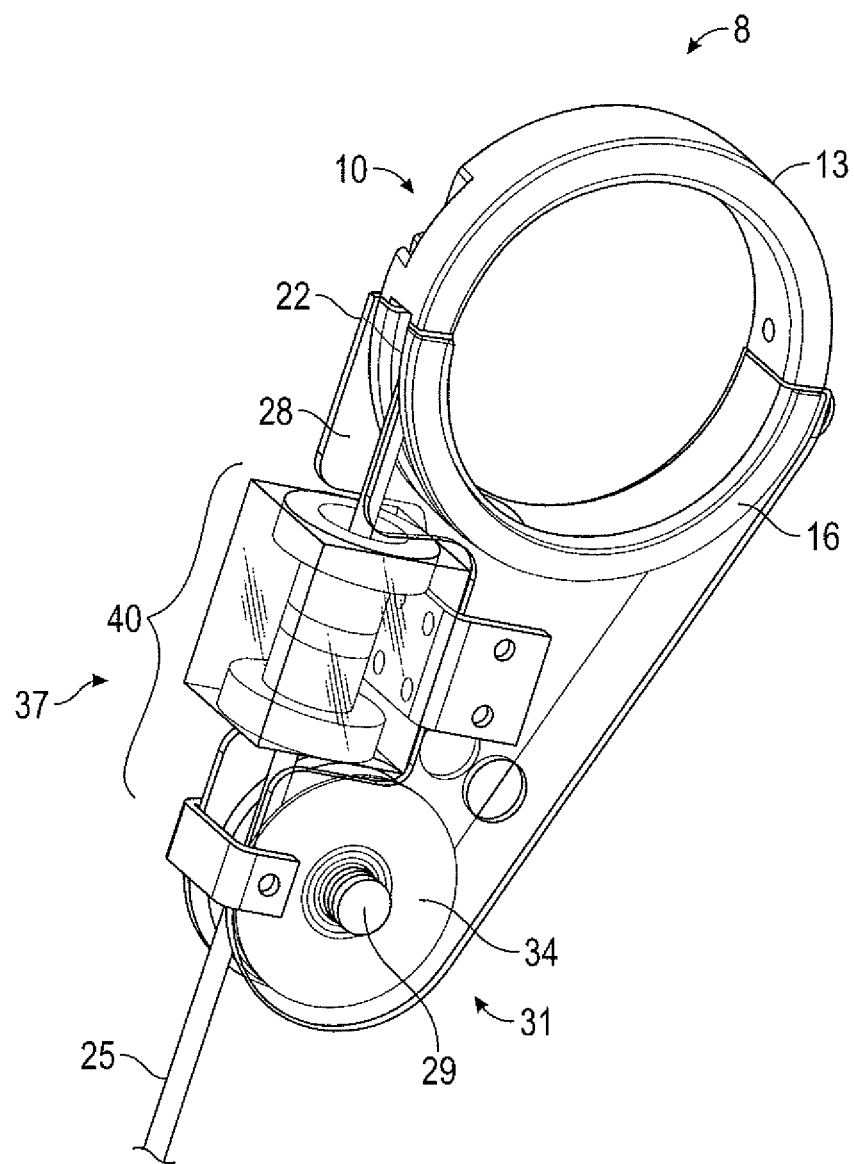
FIG. 1 is a perspective view of one embodiment of a rope sensor assembly of the present invention.

At the outset, it should be clearly understood that like reference numerals are intended to identify the same structural elements, portions or surfaces consistently throughout the several drawing figures, as such elements, portions or surfaces may be further described or explained by the entire written specification, of which this detailed description is an integral part. Unless otherwise indicated, the drawings are intended to be read (e.g., cross-hatching, arrangement of parts, proportion, debris, etc.) together with the specification, and are to be considered a portion of the entire written description of this invention. As used in the following description, the terms "horizontal", "vertical", "left", "right", "up" and "down", as well as adjectival and adverbial derivatives thereof, (e.g., "horizontally", "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or of rotation, as appropriate.

Figure 2:
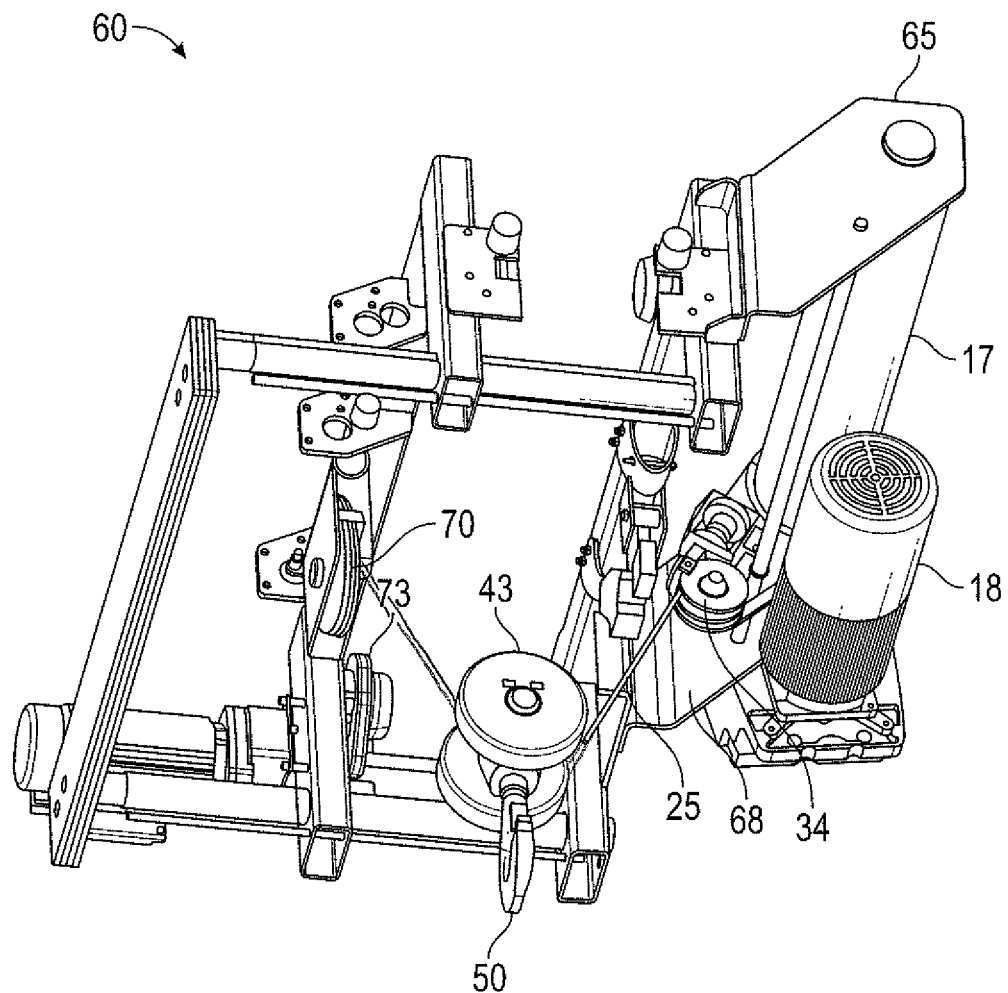
FIG. 2 is a perspective view of the rope sensor assembly shown in FIG. 1 on a monorail wire rope hoist.

Referring now to FIGS. 1-5 generally, and initially to FIG. 1 thereof, this invention provides a rope sensor assembly 8 with a rope guide 10 having a first portion 13 and a second portion 16 configured to connect together to form a ring shaped member around a rotating drum 17 (FIG. 2). The rotating drum 17 has a spiral shaped groove (not shown) defined therein. The rope guide 10 has an opening 22 defined therein that receives a hoisting rope 25. The structure of the rope guide 10 surrounding the opening 22 restricts the rope 10 from moving laterally and thereby keeps the hoisting rope 25 in position in the spiral groove on the rotating drum 17 as the rope 10 winds around the rotating drum 17 and unwinds from the rotating drum 17. The winding and unwinding of the rope 10 from the rotating drum 17 corresponds with the hoist raising and lowering a load as will be described herein. The rope guide 10 travels laterally relative to the rotating drum 17 in accordance with the movement of the spiral groove from right to left and vice versa as the drum 17 rotates.

The second portion 16 of the rope guide 10 may be provided with a support member 28 in the form of a flat plate that extends outward from the ring formed around the drum 17. At a distal end 31 of the support member 28, an idler sheave 34 is supported such that the hoisting rope 25 travels in a substantially straight line between the opening 22 in the rope guide 10 to a groove on the idler sheave 34 sized to receive the hoisting rope. The idler sheave 34 rotates freely on an axle 29 mounted on the support member 28.

A magnetic flux leak sensor 37 is disposed between the opening in the rope guide 10 and the idler sheave 34. The magnetic flux leak sensor 37 is integrated with the rope guide 10 to improve the safety of a wire rope hoist by capturing the broken wire and other rope defects during operation. The hoisting rope 25 may be magnetized by two permanent magnets in a sensing head. The radial magnetic flux leakage corresponding to the rope defect, such as a broken strand, is detected by Hall effect sensors as the rope passes through the sensing head. The integrated sensing system monitors the condition continuously to produce a more reliable result than a conventional visual inspection, without shutting down the wire rope hoist. The integrated sensing system processes the Hall voltage signal and may wirelessly communicate with a software application installed on a mobile device to alert a user to replace the rope 25 or perform preventative maintenance.

Figure 3:
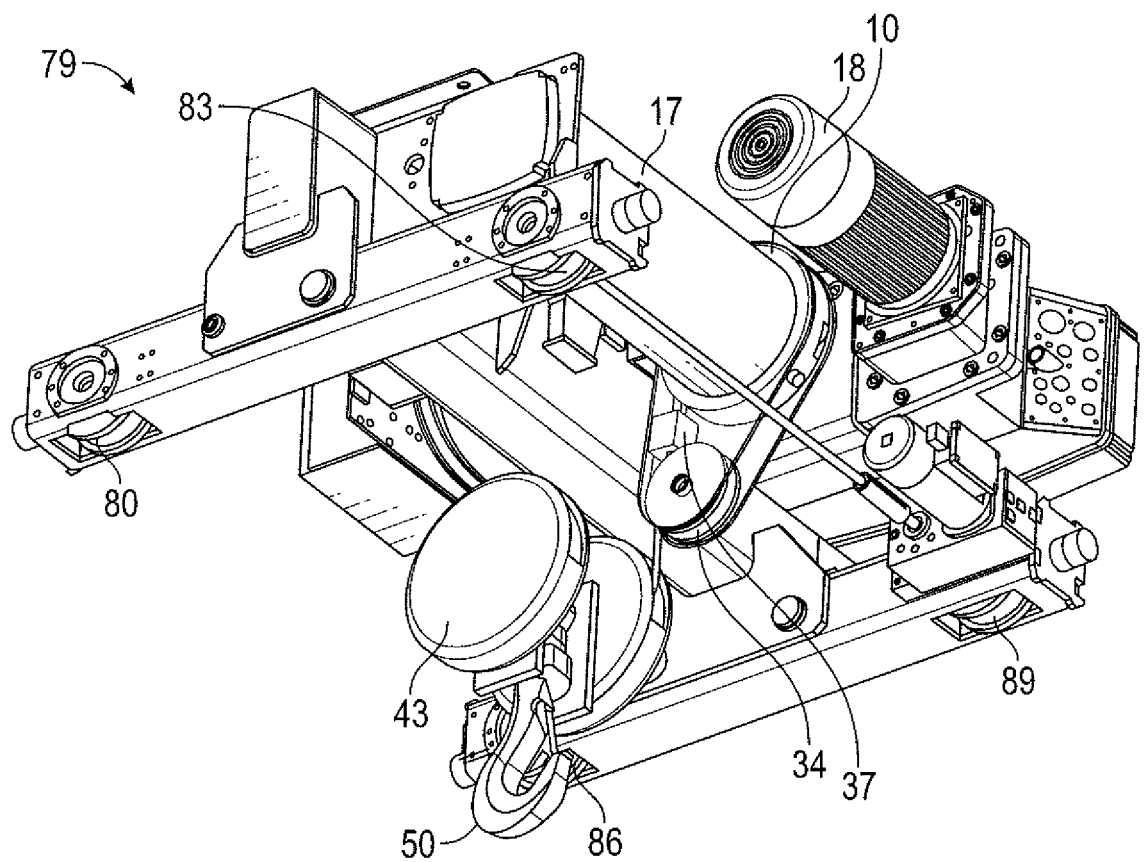
FIG. 3 is a perspective view of the rope sensor assembly shown in FIG. 1 on a top running wire rope hoist.

As shown in FIG. 1, a straight rope section 40 is formed independent of the position of a bottom block 43 (shown in FIGS. 2 and 3). The idler sheave 34 may be configured to guide the rope 25 with a small deflection angle to reduce the rope reaction on the sheave 34 when the bottom block 43 moves to its upper and lower limit positions. The sensor 37 travels along the rotating drum 17 with the rope guide 10 and the idler sheave 34 to scan the surface of the entire rope 25 as it winds and unwinds from the rotating drum 17 during service. As described in greater detail herein, the integrated sensing system may be used on both a monorail and a top running hoist trolley regardless of the reeving style of the specific hoist. The headroom of the monorail hoist is maintained by moving the drum and gear motor to a higher position.

Turning to FIG. 2, the rope sensor assembly 8 may be installed on a monorail wire rope hoist 60. The monorail wire rope hoist 60 mounts on the flange of an I-beam and runs underneath the I-beam along the longitudinal axis. The rotating drum 17 is mounted to the side by angled support members 65, 68 and is powered by an electric motor 18. The rope 25 extends from the rotating drum 17 downward through the rope sensor assembly 8 to the bottom block 43 supporting a hook 50. The bottom block 43 may be supported from a system of sheaves 70, 73 as will be evident to those of ordinary skill in the art based on this disclosure. As shown the rotating drum 17 and gear motor 18 may configured such that they are supported upward and to the right to provide headroom for the bottom block 43 to lift the load.

Turning to FIG. 3, the rope sensor assembly 8 may also be installed on a top running wire rope hoist 79. The top running wire rope hoist 79 is designed to travel on wheels 80, 83, 86, and 89 on top of support beams.

Figure 4:
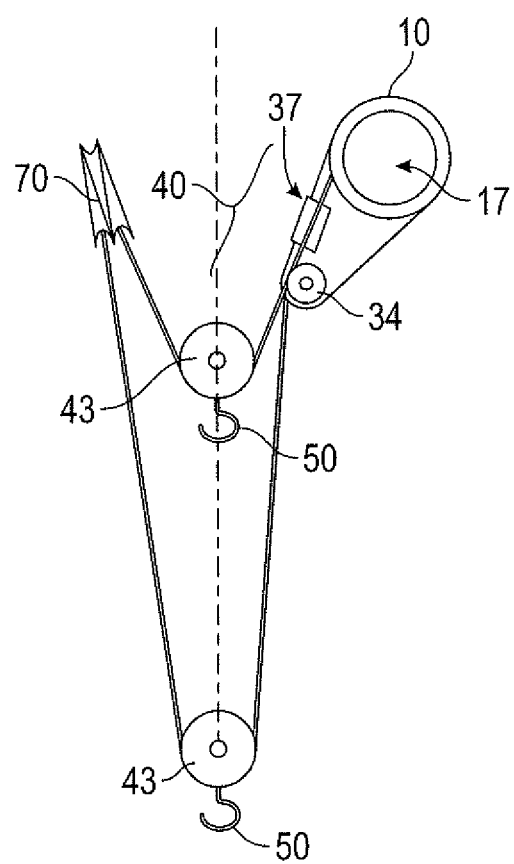
FIG. 4 is a schematic diagram of one embodiment of the system of the present invention.

As best shown in FIG. 4, a straight wire rope section 40 may be formed between the opening 22 in the rope guide 10 and the idler sheave 34. The straight wire rope section 40 may be maintained regardless of the position of the bottom block 43. As shown during operation of the hoist, the bottom block 43 may travel between upper and lower limit positions while the straight rope section 40 is unaffected.

Figure 5:
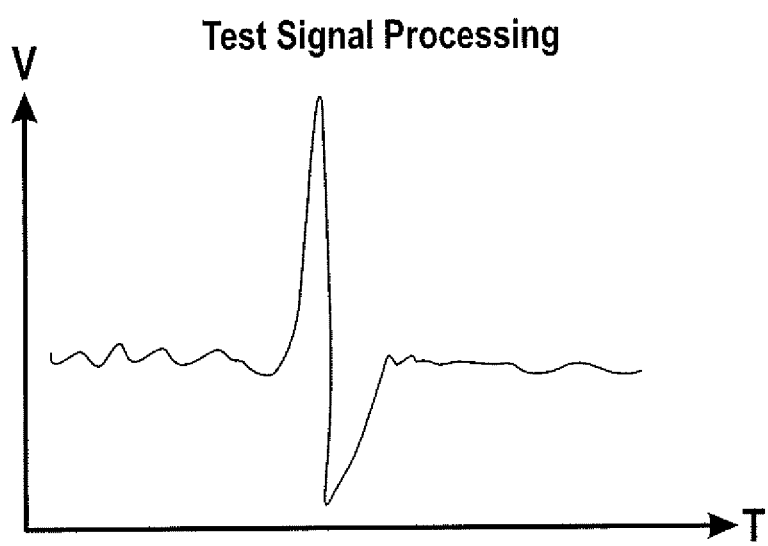
FIG. 5 is a diagram of a sample signal generated by the integrated wire rope sensor.

Turning to FIG. 5, as shown in the graph the integrated sensing system may monitor the Hall Voltage signal ("V") for a period of time ("T"). When a break is detected in the wire rope 25, a discontinuity in the voltage appears in the graph. The discontinuity may trigger a signal being communicated from the sensing system to a user's device to alert the user to replace the wire rope 25 or to perform maintenance on it. The signal may be sent wirelessly to a mobile device as will be evident to persons of ordinary skill in the art based on this disclosure.

The present invention contemplates that many changes and modifications may be made. Therefore, while the presently-preferred form of the rope sensor assembly and rope hoist system has been shown and described, and several modifications and alternatives discussed, persons skilled in this art will readily appreciate that various additional changes and modifications may be made without departing from the spirit of the invention, as defined and differentiated by the following claims.

The invention claimed is:

1. A hoisting rope sensor assembly comprising:
   a hoisting rope;

a rope guide configured to mount around a rotating drum having a spiral rope groove defined therein, the spiral rope groove on the rotating drum configured to receive the hoisting rope as it winds and unwinds from the rotating drum, the rope guide configured to move laterally relative to the rotating drum to keep the hoisting rope in the spiral rope groove when winding the hoisting rope into the rope groove or unwinding it from the rope groove;

an idler sheave having a groove defined therein for guiding the hoisting rope;

a magnetic flux leakage sensor surrounding the hoisting rope, the magnetic flux leakage sensor disposed between the idler sheave and the rope guide;

wherein the magnetic flux leakage sensor and idler sheave move with the rope guide relative to the rotating drum; and, wherein a straight rope section is formed between the idler sheave and the rope guide, the straight rope section formed independent of the position of a bottom block.

2. The hoisting rope sensor assembly of claim 1, wherein the idler sheave is mounted to a support frame.

3. The hoisting rope sensor assembly of claim 1, wherein the rope guide is mounted to a support frame.

4. The hoisting rope sensor assembly of claim 1, wherein the hoisting rope is magnetized by at least two permanent magnets in a sensing head.

5. The hoisting rope sensor assembly of claim 4, wherein a radial magnetic flux leakage corresponding to a rope defect is detected by Hall effect sensors as the hoisting rope passes through the sensing head.

6. The hoisting rope sensor assembly of claim 1, wherein the idler sheave is arranged to guide the hoisting rope with a small deflection angle to reduce the hoisting rope reaction on the sheave when the bottom block moves to its upper and lower limit positions.

7. The hoisting rope sensor assembly of claim 1, wherein the hoisting rope is a wire rope.

8. The hoisting rope sensor assembly of claim 1, wherein the rope guide surrounds the rotating drum.

9. The hoisting rope sensor assembly of claim 1, wherein the rope sensor assembly is mounted on a monorail wire rope hoist.

10. The hoisting rope sensor assembly of claim 1, wherein the rope sensor assembly is mounted on a top running wire rope hoist.

11. A rope hoist system for raising and lowering a load, the wire rope hoist system, comprising:

a rotating drum having a spiral rope groove defined therein;

a shaft operatively associated with the rotating drum;

a motor configured to engage with and rotate the shaft;

a hoisting rope affixed to the drum and configured to wind into and unwind from the spiral rope groove;

a rope guide configured to mount around the rotating drum, the rope guide configured to move laterally relative to the rotating drum to keep the hoisting rope in the spiral rope groove when winding the hoisting rope into the rope groove or unwinding it from the rope groove;

an idler sheave having a groove defined therein for guiding the hoisting rope;

a magnetic flux leakage sensor surrounding the hoisting rope, the magnetic flux leakage sensor disposed between the idler sheave and the rope guide;

wherein the magnetic flux leakage sensor and idler sheave move with the rope guide relative to the rotating drum;

a bottom block having a hook extending therefrom, the lower block having one or more sheaves with grooves configured to receive the hoisting rope for raising and lowering the load; and, wherein a straight rope section is formed between the idler sheave and the rope guide, the straight rope section formed independent of the position of the bottom block.

12. The rope hoist system of claim 11, wherein the idler sheave is mounted to a support frame.

13. The rope hoist system of claim 11, wherein the rope guide is mounted to a support frame.

14. The rope hoist system of claim 11, wherein the hoisting rope is magnetized by at least two permanent magnets in a sensing head.

15. The rope hoist system of claim 14, wherein a radial magnetic flux leakage corresponding to a rope defect is detected by Hall effect sensors as the hoisting rope passes through the sensing head.

16. The rope hoist system of claim 11, wherein the idler sheave is arranged to guide the hoisting rope with a small deflection angle to reduce the hoisting rope reaction on the sheave when the bottom block moves to its upper and lower limit positions.

17. The rope hoist system of claim 11, wherein the hoisting rope is a wire rope.

18. The rope hoist system of claim 11, wherein the rope guide surrounds the rotating drum.

19. The rope hoist system of claim 11, wherein the rope hoist is a monorail wire rope hoist.

20. The rope hoist system of claim 11, wherein the rope hoist is a top running wire rope hoist.

* * * * *